United States Patent
Winkler et al.

(10) Patent No.: US 9,567,519 B2
(45) Date of Patent: Feb. 14, 2017

(54) COMPOSITE CERAMIC WHICH COMPRISES A CONVERSION PHOSPHOR AND A MATERIAL HAVING A NEGATIVE COEFFICIENT OF THERMAL EXPANSION

(71) Applicant: Merck Patent GmbH, Darmstadt (DE)

(72) Inventors: Holger Winkler, Darmstadt (DE); Thomas Juestel, Witten (DE); Julian Plewa, Muenster (DE)

(73) Assignee: Merck Patent GmbH, Darmstadt (DE)

( * ) Notice: Subject to any disclaimer, the term of this patent is extended or adjusted under 35 U.S.C. 154(b) by 103 days.

(21) Appl. No.: 14/387,876

(22) PCT Filed: Mar. 2, 2013

(86) PCT No.: PCT/EP2013/000609
§ 371 (c)(1),
(2) Date: Sep. 25, 2014

(87) PCT Pub. No.: WO2013/143645
PCT Pub. Date: Oct. 3, 2013

(65) Prior Publication Data
US 2015/0041712 A1    Feb. 12, 2015

(30) Foreign Application Priority Data
Mar. 29, 2012  (EP) .................... 12002303

(51) Int. Cl.
*C04B 35/195* (2006.01)
*C04B 35/44* (2006.01)
(Continued)

(52) U.S. Cl.
CPC ......... *C09K 11/7776* (2013.01); *C04B 35/195* (2013.01); *C04B 35/44* (2013.01);
(Continued)

(58) Field of Classification Search
CPC ............... C09K 11/025; C09K 11/7728; C09K 11/7721; C09K 11/7715; C09K 11/57; C09K 11/62813; C09K 11/32; C04B 35/495; C04B 35/50; C04B 35/62813; C04B 35/62894
See application file for complete search history.

(56) References Cited

U.S. PATENT DOCUMENTS 5,919,720 A  7/1999 Sleight et al.
7,049,257 B2  5/2006 Omote et al.
(Continued)

FOREIGN PATENT DOCUMENTS

CN   1266826 A   9/2000
CN   101142857 A  3/2008
(Continued)

OTHER PUBLICATIONS

International Search Report from PCT/EP2013/000609 dated Jul. 19, 2013.
(Continued)

*Primary Examiner* — Carol M Koslow
(74) *Attorney, Agent, or Firm* — Millen White Zelano and Branigan, PC; John Sopp; Anthony Zelano

(57) ABSTRACT

The present invention relates to a composite ceramic which comprises a conversion phosphor and a further material, characterized in that the further material has a negative coefficient of thermal expansion, and to a process for the preparation thereof. Furthermore, the present invention also relates to the use of the composite ceramic according to the invention as emission-converting material, preferably in a white light source, and to a light source, a lighting unit and a display device.

19 Claims, 2 Drawing Sheets

(51) Int. Cl.

| | |
|---|---|
| *C04B 35/626* | (2006.01) |
| *C04B 35/628* | (2006.01) |
| *C09K 11/77* | (2006.01) |
| *H01L 33/50* | (2010.01) |
| *F21V 9/10* | (2006.01) |

(52) U.S. Cl.
CPC .. *C04B 35/62675* (2013.01); *C04B 35/62807* (2013.01); *C04B 35/62813* (2013.01); *C04B 35/62886* (2013.01); *C09K 11/7774* (2013.01); *C04B 2235/322* (2013.01); *C04B 2235/326* (2013.01); *C04B 2235/3217* (2013.01); *C04B 2235/3222* (2013.01); *C04B 2235/3225* (2013.01); *C04B 2235/3229* (2013.01); *C04B 2235/3244* (2013.01); *C04B 2235/3256* (2013.01); *C04B 2235/3258* (2013.01); *C04B 2235/443* (2013.01); *C04B 2235/5436* (2013.01); *C04B 2235/5445* (2013.01); *C04B 2235/604* (2013.01); *C04B 2235/661* (2013.01); *C04B 2235/764* (2013.01); *C04B 2235/80* (2013.01); *C04B 2235/9607* (2013.01); *H01L 33/502* (2013.01); *Y02B 20/181* (2013.01)

(56) References Cited

U.S. PATENT DOCUMENTS

| | | | |
|---|---|---|---|
| 2005/0032625 | A1 | 2/2005 | Omote et al. |
| 2009/0002810 | A1* | 1/2009 | Jeon ................ C09K 11/7734 359/361 |
| 2010/0084962 | A1 | 4/2010 | Winkler et al. |
| 2010/0181585 | A1* | 7/2010 | Juestel ................ C04B 35/44 257/98 |
| 2010/0264809 | A1 | 10/2010 | Winkler et al. |
| 2012/0178193 | A1 | 7/2012 | Lei et al. |
| 2013/0049575 | A1 | 2/2013 | Fujita et al. |

FOREIGN PATENT DOCUMENTS

| | | |
|---|---|---|
| CN | 101632181 A | 1/2010 |
| TW | 200902685 A | 1/2009 |
| TW | 200936729 A | 9/2009 |
| WO | 2006/097876 A1 | 9/2006 |
| WO | 2006097876 A1 | 9/2006 |
| WO | 2008/110976 A2 | 9/2008 |
| WO | 2008110976 A3 | 9/2008 |
| WO | 2011038680 A1 | 4/2011 |
| WO | 2012/008306 A1 | 1/2012 |

OTHER PUBLICATIONS

DIN, 51 045 "Determination of the thermal expansion of solids—Principles" [1989], Teil 1, 8 pages. (includes the English Translation).

Office Action related to the corresponding Chinese Patent Application No. 201380017859.7 dated Sep. 30, 2015.

English Machine Translation of JP 2012052061—Publication Date: Mar. 15, 2012.

English Abstract of WO 2012/008306—Publication Date: Jan. 19, 2012.

J.S.O. Evans et al., "Negative Thermal Expansion in a Large Molybdate and Tungstate Family", Journal of Solid Stale Chemistry 133, 580-583 (1997).

1st Office Action relating to Japanese Application No. 2015-502122 dated Oct. 4, 2016.

English translation of Chinese Office Action dated May 16, 2016, (7 page).

English translation ABSTRACT of CN101632181A published Jan. 20, 2010, (1 page).

English Translation of Search Report corresponding to Taiwanese Patent Application No. 102111261—Date of Completion—Sep. 23, 2016.

* cited by examiner

COMPOSITE CERAMIC WHICH COMPRISES A CONVERSION PHOSPHOR AND A MATERIAL HAVING A NEGATIVE COEFFICIENT OF THERMAL EXPANSION

The present invention relates to a composite ceramic and to a process for the preparation thereof. Furthermore, the present invention also relates to the use of the composite ceramic according to the invention as emission-converting material, preferably in a white light source, and to a light source, a lighting unit and a display device.

The prior art discloses various compounds which exhibit emission of visible light when they are excited with light in the blue spectral region or in the UV region. These so-called conversion phosphors are employed in light sources either in the form of powders or as ceramics. The best-known conversion phosphors are YAG:Ce (cerium-doped yttrium aluminium garnet) or LuAG:Ce (cerium-doped lutetium aluminium garnet), which, owing to their emission in the yellow spectral region on excitation by blue light, make a white light source possible.

If conversion phosphors are used in the form of powders, they have the disadvantage of high back-scatter of the emitted light from the light source, so that "package gain" (possible packing density in a light source) and thus the efficiency is reduced. Since the scatter coefficient in powders comprising conversion phosphors is dependent on the particle size, attempts are being made to reduce the undesired scatter effects by the synthesis of nanoparticles. However, the use of a conversion phosphors doped with rare earths in the form of nanoparticles often results in poor luminescence properties owing to strong surface defects and strong agglomeration owing to the small particle size. Although certain conversion phosphors employed in the form of powders, such as, for example, YAG:Ce or LuAG:Ce, exhibit good efficiency owing to low scatter effects, the light quantum yield here is, however, still capable of improvement.

Conversion phosphors in the form of ceramics are suitable, for example, for the conversion of high-energy radiation, such as X-rays or gamma radiation, into visible light. Scintillator ceramics of this type are usually doped with rare earths and consist, for example, of $Lu_2SiO_5$:Ce or $Gd_2O_2S$:Ce,Pr. However, various cerium-doped ceramics can also be employed as conversion phosphors in light sources, such as, for example, LEDs (light emitting devices) (WO 2007/107915) in order to achieve a certain colour distribution. The use of ceramics generally results in higher light quantum yields than in the case of powders, but the efficiency of the conversion from blue to yellow light is usually still very low, since a large amount of energy is lost as heat. The prior art discloses YAG ceramics, doped, in particular, with rare earths, for use in LEDs (WO 2008/012712). In particular, the emission from various doped rare-earth garnet compounds (US 2010/0277673 A1) is also utilised as backlighting in LCDs (liquid crystal displays). Attempts are being made to find luminescent ceramics as converters for solid-state light sources which exhibit a high light quantum yield and high efficiency. Since most conversion phosphors, such as, for example, YAG:Ce, have low thermal conductivity, the energy lost as heat cannot easily be dissipated. This thermal stress results in defect and crack formation in the ceramic, causing the thermal conductivity to drop even further and the scattering capacity in turn to increase greatly. A light source which comprises a ceramic of this type as emission-converting material drops considerably in efficiency in the course of the operating time.

There is a demand for conversion phosphors which, besides a high light quantum yield and high efficiency, also facilitate a long life of the light source.

The object of the present invention was thus to provide an emission-converting material for a light source which has high efficiency and a high light quantum yield, and which enables the production of a light source which has a long life.

Surprisingly, it has been found that a composite ceramic which comprises a conversion phosphor and a further material having a negative coefficient of thermal expansion provides all these said advantages.

The term "composite" in "composite ceramic" is intended to take into account the circumstance that its microstructure has at least two particle types. The first particle type is formed by the conversion phosphor and the other particle type is formed by the said further material. The further material here is intended to compensate for the thermal expansion of the conversion phosphor material through having a negative coefficient of thermal expansion.

In the present application, the term "conversion phosphor" is taken to mean a material which absorbs radiation in a certain wavelength region of the electromagnetic spectrum, preferably in the blue or UV region, in particular in the blue spectral region, and emits visible light in another wavelength region of the electromagnetic spectrum.

The term "emission-converting material" in the present application is intended to be taken to mean a material which comprises at least one conversion phosphor and optionally a further material, preferably a material having a negative coefficient of thermal expansion.

The conversion phosphor is preferably a Ce-, Eu- and/or Mn-containing material. The Ce-, Eu- and/or Mn-containing material is preferably an inorganic ceramic material, in which some of the lattice sites are particularly preferably occupied by $Ce^{3+}$, $Eu^{2+}$, $Eu^{3+}$ and/or $Mn^{2+}$ or $Mn^{4+}$ ions.

The content of Ce, Eu and/or Mn in the Ce-, Eu- and/or Mn-containing material is preferably in the range from 0.01 to 5 atom-%, also preferably in the range from 0.01 to 5 atom-%, and more preferably 0.05 to 3 atom-%, based on the total number of atoms at the lattice sites which are replaced by the Ce, Eu and/or Mn in the Ce-, Eu- and/or Mn-containing material, i.e., for example, based on Y in YAG.

Ce-, Eu- and/or Mn-containing materials which are preferred in accordance with the invention are those which are known per se to the person skilled in the art for their suitability as conversion phosphor in light-emitting diodes. These are, in particular, silicates, such as orthosilicates, oxyorthosilicates, disilicates, sialones, silicooxynitrides, siliconitrides, aluminates, garnets, and further ternary and quaternary oxides and nitrides.

It is particularly preferred for the Ce-, Eu- and/or Mn-containing material to be a Ce-, Eu- and/or Mn-containing garnet. In accordance with the invention, a garnet is preferably taken to mean rock-forming minerals having a chemical composition of the form

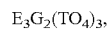

where
E are di- or trivalent cations surrounded by 8 oxygen anions;
G are di-, tri- or tetravalent cations, preferably trivalent cations, surrounded by 6 oxygen anions; and
T are tri- or tetravalent cations surrounded by 4 oxygen anions.

In accordance with the invention, the garnet is preferably a Ce-containing garnet. In accordance with the invention, this is preferably taken to mean a garnet in which some of the cations E have been replaced by $Ce^{3+}$ ions. For simplicity, the Ce-containing garnet is abbreviated to $E_3G_2(TO_4)_3$:Ce in this application.

E in $E_3G_2(TO_4)_3$:Ce is preferably selected from the group consisting of Y, Sm, Eu, Gd, Tb, Dy, Ho, Er, Tm, Lu or mixtures thereof. G and T in $E_3G_2(TO_4)_3$:Ce are preferably selected, independently of one another, from the group consisting of Al, Sc, Ga or mixtures thereof. Alternatively, G and T may also stand for the combination Mg/Si or Mg/Ge or mixtures thereof, where Mg and the tetravalent element Si or Ge are then present in the same molar proportions.

"Coefficient of thermal expansion" is taken to mean a characteristic quantity which describes the behaviour of a substance with respect to changes in its dimensions on changes in temperature. The effect responsible for this is thermal expansion. Thermal expansion is dependent on the substance used, i.e. is a substance-specific material constant. Its unit of measure is $K^{-1}$. If it is positive, a substance expands with increasing temperature. If it is a negative quantity, the dimension of the substance decreases with increasing temperature. Since in the case of many substances thermal expansion does not occur uniformly over all temperature ranges, the coefficient of thermal expansion is itself also temperature-dependent and is therefore quoted for a certain reference temperature or a certain temperature range. The coefficient of thermal expansion is determined as follows for the purposes of this invention: since the coefficient of thermal expansion cc is highly dependent on the microstructure of the ceramic, the cc value for the composites must be determined experimentally with the aid of a dilatometer. Using a push-rod dilatometer, the change in length of the composite ceramics under the action of heat is measured in accordance with the DIN 51045 standard. The coefficient of thermal expansion of the further material which is present in the composite ceramic and which in accordance with the invention has a negative coefficient of thermal expansion is also determined correspondingly.

In the present invention, the negative coefficient of thermal expansion of the further material is preferably in the range from $1*10^{-6}$ to $12*10^{-6}$ $K^{-1}$, particularly preferably in the range $3*10^{-6}$ to $10*10^{-6}$, in the case of a temperature change in the range from 20° C. to 200° C.

The further material in the composite material according to the invention which has a negative coefficient of thermal expansion is preferably a tungstate or molybdate or a mixed oxide thereof. The further material is particularly preferably selected from the group consisting of $Al_2W_3O_{12}$, $Y_2W_3O_{12}$, $YAlW_3O_{12}$, $ZrW_2O_8$, $Al_2Mo_3O_{12}$, $Y_2Mo_3O_{12}$, $YAlMo_3O_{12}$, $ZrMo_2O_8$, $Al_2WMo_2O_{12}$, $Y_2WMo_2O_{12}$, $YAlWMo_2O_{12}$, $ZrWMoO_8$, $Al_2MoW_2O_{12}$, $Y_2MoW_2O_{12}$, $YAlMoW_2O_{12}$ or mixtures thereof.

It may also be preferred here for the material having the negative coefficient of thermal expansion to be coated. Suitable coatings are, for example, inorganic oxides, such as, for example, aluminium oxide or silicon oxide.

The molar ratio of the conversion phosphor to the further material is preferably in the range from 1:0.5 to 10:1, preferably from 1:1 to 5:1. The precise molar ratio depends, in particular, on how the coefficients of thermal expansion of the conversion phosphor and of the further material behave relative to one another. The conversion phosphor generally has a positive coefficient of thermal expansion and thus expands with increasing temperature. In order to compensate for this expansion, the further material employed is a material having a negative coefficient of thermal expansion. The coefficient of expansion of the further material should be negative to the extent that the coefficient of expansion of the conversion phosphor is positive. In this ideal case, the two materials should be employed in a molar ratio of 0.9:1 to 1:0.9. The molar ratio of the two components should be adapted to one another to the extent that the positive coefficient of expansion of the conversion phosphor is greater than the modulus of the negative coefficient of expansion of the further material. In other words, the molar ratio of the two components in the composite ceramic should be approximately in direct proportion to the ratio of the moduli of their coefficients of thermal expansion.

The present invention also relates to a process for the preparation of a composite ceramic, preferably the composite ceramic according to the invention, which comprises the following steps:

a) provision of a conversion phosphor;
b) provision of a material having a negative coefficient of thermal expansion;
c) mixing of the two components provided in steps a) and b) to give a mixture; and
d) sintering of the mixture.

In accordance with the invention, the conversion phosphor provided in step a) shall be defined in exactly the same way as with regard to the composite ceramic according to the invention. The conversion phosphor here is preferably provided in powder form. The average particle size of the conversion phosphor powder here is preferably in the range from 0.1 to 1 μm.

The material having the negative coefficient of thermal expansion provided in step b) shall be defined herein in exactly the same way as the further material defined in relation to the composite ceramic. It is preferably likewise employed in powder form and its average particle size is preferably in the range from 1 to 10 μM.

In step c) of the process according to the invention, the materials provided in steps a) and b) are mixed with one another. The powders can be mixed with one another in the dry state or in the form of a suspension by addition of a solvent. Suitable solvents are conventional solvents, for example ethanol or isopropanol. The mixing in step c) is preferably carried out in a ball mill. It is preferred for the mixing to be continued until the average particle size of the powder is in the range from 0.1 to 1 μm. It is helpful here to employ particular additives in order to counter the formation of agglomerates. For oxidic powders, use is usually made of so-called polyelectrolytes, for example Darvan (Vanderbilt), Dolapix (Zschimer & Schwertz), KD1 (Uniqema).

After mixing, the resultant powder mixture can be processed further. The powder mixture is preferably pressed uniaxially and isostatically in two steps in the form of thin discs, where the pressing pressure is in the range from 100 to 300 MPa.

In accordance with the invention, the sintering in step d) is carried out at a suitable temperature. If the conversion phosphors in step a) are provided without a coating, the sintering is carried out at a temperature below the melting point of the material having a negative coefficient of thermal expansion. It has been found that good results are achieved if the sintering temperature is ⅔ to ⅚ of the melting temperature of the material having a negative coefficient of thermal expansion. If the conversion phosphor carries an inertising coating which is stable under the processing conditions, the sintering in this variant of the invention can also be carried out in the region of the melting temperatures or slightly above them. The sintering is preferably carried out at a temperature in the range from 800 to 1600° C., more preferably in the range from 1000 to 1600° C. The sintering is preferably carried out in a sintering oven. The sintering is preferably carried out under a protective-gas atmosphere ($N_2$ or Ar), alternatively under a reducing atmosphere, such as forming gas.

The present invention additionally relates to an alternative process for the preparation of a composite ceramic, preferably a composite ceramic according to the invention, which comprising the following steps:

a') coating of a conversion phosphor with an oxide of aluminium;
b') mixing of the coated conversion phosphor obtained in step a') with a W- or Mo-containing component to give a mixture; and
c') sintering of the mixture obtained in step b') at a temperature in the range from 1000 to 1600° C., preferably in the range from 1400 to 1600° C.

The conversion phosphor provided in step a') should in accordance with the invention be defined in exactly the same way as with regard to the composite ceramic according to the invention. The conversion phosphor is preferably provided in powder form here. The average particle size of the conversion phosphor powder here is preferably in the range from 1 to 10 μm.

The oxide of aluminium employed can be any oxidic aluminium compound which is capable of forming a material having a negative coefficient of thermal expansion on sintering in step c') with the W- or Mo-containing compound. The oxide of aluminium employed is preferably $Al_2O_3$ particularly preferably as the γ-modification.

A W- or Mo-containing component is taken to mean an inorganic compound which can be reacted with the oxide of aluminium by sintering to give a material having a negative coefficient of thermal expansion. The W- or Mo-containing components employed are preferably $WO_3$ or $MoO_3$. The material having the negative coefficient of thermal expansion shall be defined herein in exactly the same way as the further material defined in relation to the composite ceramic.

The alternative preparation process gives in step c') a composite ceramic in which particles of the conversion phosphor are surrounded by the material having the negative coefficient of thermal expansion.

The present invention furthermore relates to the use of the composite ceramic according to the invention or the composite ceramic prepared by the processes according to the invention as emission-converting material. Due to the presence of a conversion phosphor in the composite ceramic, the composite ceramic also has the property that light/radiation of one excitation wavelength can be converted into light of another wavelength. The emission-converting material is therefore preferably employed in a light source. It is particularly preferred for the light source to be or to contain an LED (light-emitting diode). It is furthermore preferred for the light source to emit white light.

The present invention thus furthermore also relates to a light source which comprises a component ceramic according to the invention or a composite ceramic prepared by the processes according to the invention. The light source can be of any type in which light from a primary light source is to be converted by a conversion phosphor. However, it is preferred for the light source to be or to contain an LED.

In the case of an LED according to the invention, the term pc-LED for "phosphor-converted LED" is also customary.

The primary light source can be a semiconductor chip, a luminescent arrangement based on ZnO, TCO (transparent conducting oxide), ZnSe or SiC, an arrangement based on an organic light-emitting layer (OLED) or a plasma or discharge source, preferably a semiconductor chip. Possible forms of light sources of this type are known to the person skilled in the art.

If the primary light source is a semiconductor chip, it is preferably a luminescent indium aluminium gallium nitride (InAlGaN), in particular of the formula $In_iGa_jAl_kN$, where $0 \le i$, $0 \le j$, $0 \le k$, and $i+j+k=1$.

The composite ceramic used in the light source is preferably applied, in the form of a homogeneous thin and non-porous platelet, directly to the surface of a primary light source in the form of a chip. This has the advantage that location-dependent variation of the excitation and emission of the conversion phosphor does not occur, causing the light source equipped therewith to emit a homogenous and colour-constant light cone and to have high light output. The composite ceramic in the form of a ceramic emission-converting moulding can, if necessary, be fixed to the chip substrate, for example using a water-glass solution.

In a preferred embodiment, the composite ceramic in the form of a ceramic emission-converting moulding has a structured (for example pyramidal) surface on the side opposite a semiconductor chip. As much light as possible can thus be coupled out of the ceramic emission-converting moulding. The structured surface on the ceramic emission-converting moulding is preferably produced by, for example in the case of isostatic pressing, the compression mould having a structured press platen and thus embossing a structure into the surface. Structured surfaces are desired if the thinnest possible ceramic emission-converting mouldings or platelets are to be produced. The pressing conditions are known to the person skilled in the art (see J. Kriegsmann, Technische keramische Werkstoffe [Industrial Ceramic Materials], Chapter 4, Deutscher Wirtschaftsdienst, 1998).

The invention furthermore relates to a lighting unit, in particular for the backlighting of display devices, which comprises at least one light source according to the invention. Lighting units of this type are employed principally in backlit display devices, in particular liquid-crystal display devices (LC display). The present invention therefore also relates to a display device of this type.

In a likewise preferred variant of the lighting unit according to the invention, the optical coupling between the emission-converting material (composite ceramic) and the primary light source (in particular semiconductor chip) preferably takes place by means of a light-conducting arrangement. It is thus possible for the primary light source to be installed at a central location and to be optically coupled to the emission-converting material by means of light-conducting devices, such as, for example, optical fibres. In this way, it is possible to achieve lamps adapted to the lighting wishes which merely consist of one or more different conversion phosphors, which may be arranged to form a light screen, and an optical waveguide, which is coupled to the primary light source. In this way, it is possible to position a strong primary light source at a location which is favourable for electrical installation and to install lamps comprising emission-converting materials, which are coupled to the optical waveguides, at any desired locations without further electrical cabling, merely by laying optical waveguides. This concept is also called "remote concept" or "remote phosphor concept". The ceramic phosphors described can be installed in lamps in such a way that the light source employed for the optical excitation is at a distance from the ceramic moulding according to the invention.

The following examples and figures are intended to illustrate the present invention. However, they should in no way be regarded as limiting. All compounds or components which can be used in the preparations are either known and commercially available, or can be synthesised by known methods.

EXAMPLES

Example 1

Figure 1:
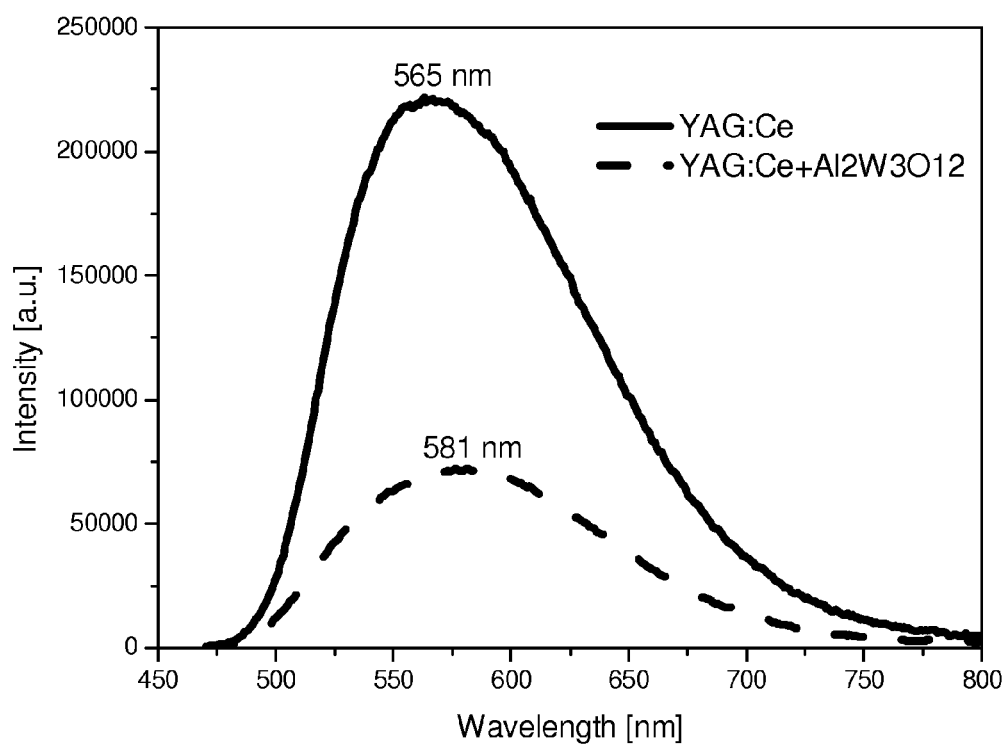
FIG. 1 shows the emission spectrum of a comparative material YAG:Ce and a composite ceramic which consists of $Y_3Al_5O_{12}$:Ce and $Al_2W_3O_{12}$ (3:1), as prepared in Example 3a. The spectrum was recorded with an Edinburgh Instruments FL900 fluorescence spectrometer, using a Xe medium-pressure lamp (Osram) as excitation source.

Preparation of a Composite Ceramic which Consists of $Y_3(Al_{1-a}Si_{a/2}Mg_{a/2})_5O_{12}$:Ce and $Al_2W_3O_{12}$ The powder components for the composite ceramic, i.e. yttrium aluminate and aluminium tungstate, are prepared separately. The starting materials used are metal nitrates $Y(NO_3)_3$, $Al(NO_3)_3$, $Ce(NO_3)_3$ for the yttrium aluminate and $Al(NO_3)_3$ with $WO_3$ in ammonia for aluminium tungstate, which are in each case mixed to give homogeneous solutions. The metal cations in the solutions are stabilised by the addition of a complexing agent (for example trisamines) and then evaporated to give a solid residue. Further heating of the dry residue results in ignition and the formation of a sponge-like precursor structure. The precursors are calcined at temperatures of 800 to 1000° C. and converted into the compounds $Y_{3-x}Ce_xAl_5O_{12}$ and $Al_2W_3O_{12}$ in the form of soft agglomerates. The $Al_2W_3O_{12}$ powder is coated with $Al_2O_3$ by wet-chemical means, where the coating process is achieved by the hydrolysis of aluminium isopropylate in alcoholic medium with addition of ammonia as catalyst in a mixing reactor.

In a subsequent step, the two powders are mixed, where the proportion by volume of the second component is in the range from 10 to 60% by vol. and is determined taking into account the dilatometric measurements of the finished ceramics.

The mixed powder is pressed uniaxially and isostatically in two steps in the form of thin discs, where the pressing pressure is in the range from 100 to 300 MPa. The subsequent sintering is achieved in air as a multistep process, where the temperatures are in the range from 1000° C. to 1600° C. The sintered ceramics are ground using a diamond suspension and cut to dimensions matched to the excitation source by means of a picolaser.

Example 2

Preparation of a Composite Ceramic which Consists of $Y_3(Al_{1-a}Si_{a/2}Mg_{a/2})_5O_{12}$:Ce and $YAlW_3O_{12}$ (3:1)

The powder components for the composite ceramics, i.e. magnesium- and silicon-doped yttrium aluminate and yttrium aluminium tungstate, are prepared separately by a ceramic method. The metal oxides in the form of fine powders are mixed, calcined and synthesised at temperatures in the range from 800° C. to 1200° C. The $YAlW_3O_{12}$ powder is coated with $Al_2O_3$ by wet-chemical means, where the coating process is achieved by the hydrolysis of aluminium isopropylate in alcohol medium with addition of ammonia as catalyst in a mixing reactor. The $Y_3(Al_{1-a}Si_{a/2}Mg_{a/2})_5O_{12}$:Ce powder is finely ground and mixed with $Al_2O_3$-coated $YAlW_3O_{12}$ powder. The mixture was shaped in the form of thin discs by two-step uniaxial and isostatic pressing, where the pressing pressure is in the range from 100 to 300 MPa. The subsequent sintering is achieved in air as a multistep process, where the temperature is in the range from 1000° C. to 1600° C. The sintered ceramics are ground using a diamond suspension and cut to dimensions matched to the excitation source by means of a picolaser.

Example 3

Specific Experimental Procedure for the Preparation of the Composite Ceramics from YAG:Ce and a Tungstate (Example 3a: $Al_2W_3O_{12}$; Example 3b: $AlYW_3O_{12}$)

Step 1.

YAG:Ce powder was prepared by a self-combustion method, where an aqueous nitrate solution of the metals was mixed with tris(hydroxymethyl)-aminomethane (TRIS: M=121.14 g/mol), dried and then ignited. The black precursor was calcined at 1000° C. and in the process converted into a finely particulate colourless powder.

8.4594 g (0.02524 mol) of $Y_2O_3$ were dissolved in 10 ml of $HNO_3$ and made up to about 250 ml with $H_2O$. 46.8913 g (0.08421 mol) of $Al(NO_3)_3*9H_2O$ and 0.03256 g (0.00005 mol) of $Ce(NO_3)_3*9\ H_2O$ were then added and dissolved.

TRIS was added to the homogeneous solution and made up to about 500 ml with $H_2O$. After warming, the $H_2O$ was evaporated, and the residues were ignited. The precursor was dried for 12 h in a drying cabinet, ground in a mortar and then calcined at 1000° C. in an oven for 1 h.

Step 2.

$Al_2W_3O_{12}$ powder was prepared by a ceramic method, where the finely particulate oxides $Al_2O_3$ and $WO_3$ were mixed and treated in two steps, firstly at a temperature of 1000° C. and then at 1100° C. (with intermediate grinding in a mortar).

1.019 g (0.01 mol) of $Al_2O_3$ (nano) was ground with 6.955 g (0.003 mol) of $WO_3$ with ethanol (agate mortar). The suspension was dried and homogenised in the mortar, then sintered at 1000° C. for 12 h, ground in a mortar and calcined at 1100° C. in air for 12 h.

Step 3.

$AlYW_3O_{12}$ powder was prepared by a ceramic method from the oxides $Al_2O_3$, $WO_3$ and $Y_2O_3$, where all oxide powders were ground together in a mortar and treated in two steps at the temperatures 1000° C. (6 h) and at 1100° C. (12 h) in air.

0.5098 g (0.005 mol) of $Al_2O_3$ (nanoscale) were ground with 6.955 g (0.003 mol) of $WO_3$ and 1.129 g (0.005 mol) of $Y_2O_3$ in ethanol. The suspension was dried and homogenised in the mortar, then sintered at 1000° C. for 12 h, ground in the mortar and calcined at 1100° C. in air for 12 h.

Step 4.

Composite ceramics comprising YAG:Ce and one of the above-mentioned metal tungstates were prepared with the aid of a mixture of $Al_2W_3O_{12}$ powder or $AlYW_3O_{12}$ powder. To this end, $Y_{2.997}Ce_{0.003}Al_5O_{12}$ powder (90-99 wt-%) and in each case one of the tungstates (1-10 wt-%) was ground in ethanol (in an agate mortar), dried, wetted with a few drops of the pressing aid polyvinylalcohol (in the agate mortar) and then pressed uniaxially (about 100 MPa) and isostatically (about 300 MPa) to give tablets (thickness about 2.5 mm, diameter about 12 mm), dried in air and finally sintered in two steps, firstly at 1000° C. for 12 h and then at 1100° C. for 2 h. Ceramic mouldings are obtained.

Comparative Example A

Preparation of a Composite Ceramic which Comprises No Material Having a Negative Coefficient of Thermal Expansion For the comparison, the composite material is prepared from YAG:Ce and $Al_2O_3$, where the YAG:Ce is prepared by the self-combustion method. The second component used is $Al_2O_3$ nanopowder (Degussa). After powder mixing (favourably in the ratio 1:1 by volume), the ceramic discs are produced in a similar manner to that in the examples described above.

Comparative Example B

As the second comparative material, ceramics comprising YAG:Ce with undoped YAG are prepared. The YAG:Ce powder is prepared by a coprecipitation method, where the starting materials used are the metal nitrates $Y(NO_3)_3$, $Al(NO_3)_3$, $Ce(NO_3)_3$ and the precipitant used is $NH_4HCO_3$. The precipitate produced is converted into YAG:Ce by calcination at 800° C. and sintering at 1000° C. After intensive grinding, the YAG:Ce becomes finely articulate and suitable for mixing with the YAG prepared in a similar manner. The mixture was shaped in the form of thin discs by two-step uniaxial and isostatic pressing, where the pressing pressure is in the range from 100 to 300 MPa. The subsequent sintering is achieved in air as a multistep process, where the temperatures are in the range from 1000 to 1600° C. The sintered ceramics are ground using a diamond suspension and cut to dimensions matched to the excitation source by means of a picolaser.

Example 4

Production of LEDs with the Composite Ceramics of Examples 3a and 3b and Comparative Examples A and B Example 4a Remote Phosphor Arrangement A platelet having a diameter of 5 mm and a thickness of 0.1 mm, consisting of the composite ceramic according to the invention, is placed on the SMD LED (chip peak wavelength 450 nm, operating current strength 350 mA, cavity opening diameter 5.5 mm) which is filled with liquid silicone OE 6550 (Dow Corning), so that the circular cavity is sealed. The component is then stored in an oven at 150° C. for 1 h, during which the silicone hardens and bonds strongly to the LED and the ceramic platelet.

Example 4b

Chip-Level Conversion Arrangement

A ceramic phosphor platelet having square dimensions of 1×1 mm and a thickness of 0.1 mm is placed directly so as to fit on the 1×1 mm LED chip of an SMD flipchip LED (chip peak wavelength 450 nm, operating current strength 350 mA) with the aid of a drop of silicone OE 6550 (Dow Corning). After the silicone has hardened over a period of 1 h at 150° C., the remaining cavity of the LED is cast out with silicone OE 6550 (Dow Corning), and the entire component is stored at 150° C. for 1 h for hardening of the silicone.

Example 5

Intensity of the Emission

Figure 2:
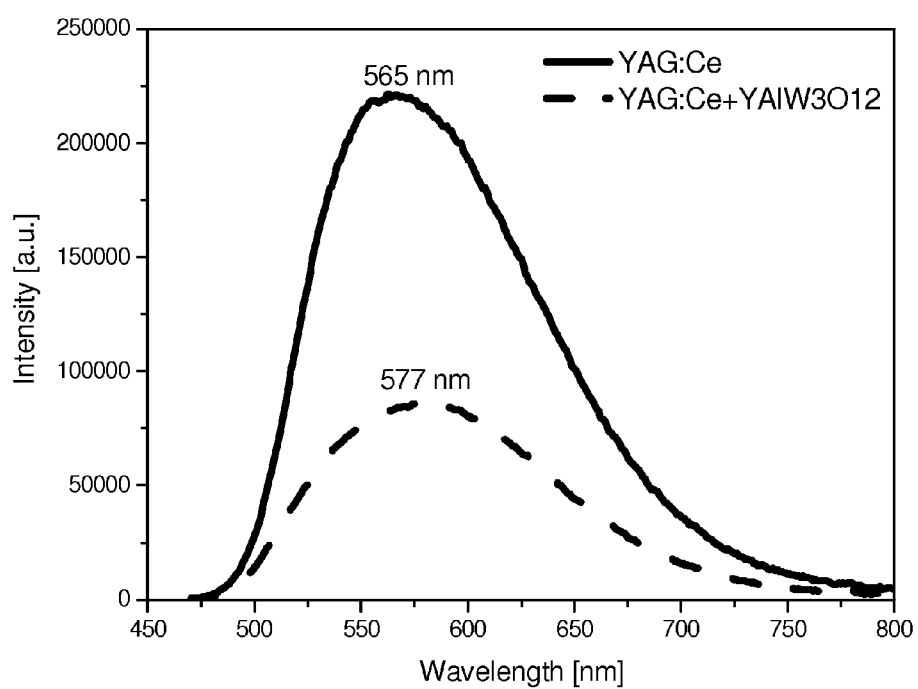
FIG. 2 shows the emission spectrum of a comparative material YAG:Ce and a composite ceramic consisting of $Y_3Al_5O_{12}$:Ce and $YAlW_3O_{12}$ (3:1), as prepared in Example 3b. The spectrum was recorded with an Edinburgh Instruments FL900 fluorescence spectrometer, using an Xe medium-pressure lamp (Osram) as excitation source.

In FIGS. 1 and 2, the composite ceramics from Examples 3a and 3b according to the invention exhibit lower intensities compared with the YAG:Ce ceramics from Comparative Examples A and B, which is to be expected since the YAG:Ce phosphor is in dilute form in the composite ceramic. The spectrum was recorded with an Edinburgh Instruments FL900 fluorescence spectrometer, where the excitation source used was an Xe medium-pressure lamp (Osram).

Example 6

Lifetime

The advantages of the composite ceramics according to the invention in accordance with Examples 1, 2 and 3 can be demonstrated with reference to long-term uses in light-emitting diodes. The material according to the invention exhibits reduced cracking in use compared with ceramics from the prior art. Accordingly, the efficiency drops less quickly, and the ceramic can be used longer with good efficiency.

The invention claimed is:

1. Composite ceramic which comprises a conversion phosphor and a further material, wherein the further material has a negative coefficient of thermal expansion which is in the range from $1*10^{-6}$ to $12*10^{-6}K^{-1}$ in the case of a temperature change in the range from 20° C. to 200° C.

2. Composite ceramic according to claim 1, in which the conversion phosphor is a Ce-, Eu- and/or Mn-containing material.

3. Composite ceramic according to claim 1, in which the conversion phosphor is a Ce-containing material.

4. Composite ceramic according to claim 3, in which the Ce-containing material is a Ce-containing garnet which has the formula $E_3G_2(TO_4)_3$:Ce, where E is selected from the group consisting of Y, Sm, Eu, Gd, Tb, Dy, Ho, Er, Tm, Lu and mixtures thereof, and G and T are each selected, independently of one another, from the group consisting of Al, Sc, Ga and mixtures thereof, or G and T together stand for the combination Mg/Si or the combination Mg/Ge, where Mg and Si or Mg and Ge respectively are present in the same molar proportions.

5. Composite material according to claim 1, in which the further material is a tungstate or molybdate.

6. Composite ceramic according to claim 1, in which the molar ratio of the conversion phosphor to the further material is in the range from 1:0.5 to 10:1.

7. Process for the preparation of a composite ceramic according to claim 1, which comprises:
   a) providing a conversion phosphor;
   b) providing a material having a negative coefficient of thermal expansion;
   c) mixing of the two components provided in steps a) and b) to give a mixture; and
   d) sintering of the mixture.

8. Process according to claim 7 wherein the sintering is carried out at a temperature in the range from ⅔ to ⅚ of the melting temperature of the material having a negative coefficient of thermal expansion.

9. Process for the preparation of a composite ceramic according to claim 1, which comprises:
   a') coating of a conversion phosphor with an oxide of aluminium;
   b') mixing of the coated conversion phosphor obtained in step a') with a W- or Mo-containing component to give a mixture; and
   c') sintering of the mixture obtained in step b') at a temperature in the range from 1000 to 1600° C., to obtain a composite ceramic which comprises a conversion phosphor and an aluminium tungstate or aluminium molybdate material which has a negative coefficient of thermal expansion in the range from $1*10^{-6}$ to $12*10^{-6} K^{-1}$ in the case of a temperature change in the range from 20° C. to 200° C.

10. An emission-converting material comprising a composite ceramic according to claim 1.

11. A light source comprising an emission-converting material according to claim 10.

12. Light source which comprises a composite ceramic according to claim 1 and a primary light source.

13. Lighting unit which comprises at least one light source according to claim 12.

14. Composite ceramic according to claim 1, in which the conversion phosphor is a Ce-, Eu- and/or containing material, which comprises 0.1 to 5 atom-% of Ce, Eu and/or Mn, based on the total number of atoms at the lattice sites which are replaced by the Ce, Eu and/or Mn in the Ce-, Eu- and/or Mn-containing material.

15. Composite ceramic according to claim 1, in which the conversion phosphor is a Ce-containing garnet.

16. Composite material according to claim 1, in which the further material is a tungstate or molybdate, which is selected from the group consisting of $Al_2W_3O_{12}$, $Y_2W_3O_{12}$, $YAlW_3O_{12}$, $ZrW_2O_8$, $Al_2Mo_3O_{12}$, $Y_2Mo_3O_{12}$, $YAlMo_3O_{12}$, $ZrMo_2O_8$, $Al_2WMo_2O_{12}$, $Y_2WMo_2O_{12}$, $YAlWMo_2O_{12}$, $ZrWMoO_8$, $Al_2MoW_2O_{12}$, $Y_2MoW_2O_{12}$, $YAlMoW_2O_{12}$ and mixtures thereof.

17. Composite ceramic according to claim 1, in which the molar ratio of the conversion phosphor to the further material is in the range from 1:1 to 5:1.

18. Composite ceramic which comprises a conversion phosphor and a further material, wherein the further material is a tungstate or molybdate and has a negative coefficient of thermal expansion.

19. Composite material according to claim 18, in which the further material is a tungstate or molybdate, which is selected from the group consisting of $Al_2W_3O_{12}$, $Y_2W_3O_{12}$, $YAlW_3O_{12}$, $ZrW_2O_8$, $Al_2Mo_3O_{12}$, $Y_2Mo_3O_{12}$, $YAlMo_3O_{12}$, $ZrMo_2O_8$, $Al_2WMo_2O_{12}$, $Y_2WMo_2O_{12}$, $YAlWMo_2O_{12}$, $ZrWMoO_8$, $Al_2MoW_2O_{12}$, $Y_2MoW_2O_{12}$, $YAlMoW_2O_{12}$ and mixtures thereof.

* * * * *